(12) United States Patent
Chang (10) Patent No.: US 6,515,362 B2
(45) Date of Patent: Feb. 4, 2003

(54) GRID ARRAY PACKAGE WITH INCREASED ELECTRICAL GROUNDING ROUTES AND METHOD OF FABRICATION

(75) Inventor: Wen-Yuan Chang, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/683,459

(22) Filed: Jan. 3, 2002

(65) Prior Publication Data

US 2002/0093079 A1 Jul. 18, 2002

(30) Foreign Application Priority Data

Jan. 12, 2001 (TW) ......................... 90100703 A (51) Int. Cl.⁷ .......................... H01L 23/12; H01L 23/52
(52) U.S. Cl. ...................... 257/750; 257/758; 257/737; 257/748
(58) Field of Search ................... 257/750, 747, 257/748, 775, 758, 737–738, 786, 697

(56) References Cited

U.S. PATENT DOCUMENTS 5,703,402 A * 12/1997 Chu et al.

* cited by examiner

*Primary Examiner*—Olik Chauduri
*Assistant Examiner*—Dilinh Nguyen
(74) *Attorney, Agent, or Firm*—Winston Hsu (57) ABSTRACT

A grid array package and a method for fabricating the same. The contact pads of the grid array package form three distinct groups: an outer array, a intermediate group, and a center array. The center array is positioned in the center of the package, the intermediate group forms a ring around the center array, and the outer array forms a ring around both the intermediate group and the inner array. The contact pads of the center array connect to ground. Most of the contact pads of the intermediate group connect to power, but selected contact pads of the intermediate group connect to ground. Within the outer array, most of the contact pads connect the integrated circuit to outside circuitry, but selected contact pads of the outer array connect to ground.

8 Claims, 6 Drawing Sheets

GRID ARRAY PACKAGE WITH INCREASED ELECTRICAL GROUNDING ROUTES AND METHOD OF FABRICATION

BACKGROUND OF INVENTION

1. Field of the Invention

The present invention relates to a grid array package, and more particularly, to a grid array package with increased electrical grounding routes and a method of fabricating the same.

2. Description of the Prior Art

Integrated circuits areused in a wide variety of electrical devices such as intelligent appliances (IA), personal computers (PC), and so on. Generally speaking, integrated circuits are enclosed inside packages to protect their fragile circuitry. The packages also function to connect integrated circuits to power, to exchange data with outside circuitry, and to ground the current of the integrated circuits. Finally, the packages are also interfaces for heat dissipation, this function becoming increasingly important for modern integrated circuits as their transistor counts and operating frequencies continue to climb. Thus, dissipation of the heat generated during the operation of integrated circuits is an important issue in designing packages.

Figure 1:
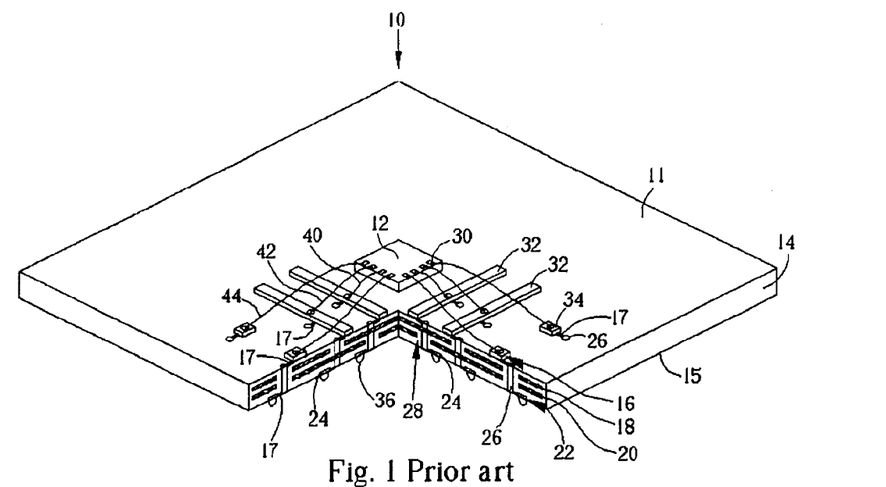
FIG. 1 is a structural schematic diagram of a grid array package according to the prior art.

Please refer to FIG. 1. FIG. 1 is a structural schematic diagram of a four-layer ball grid array package 10 for packaging an integrated circuit 12. The package 10 comprises a substrate 14 with a top surface 11 and a bottom surface 15. The package 10 further comprises an integrated circuit 12 mounted on the top surface 11 and four conducting layers located within the substrate 14:a bonding pad layer 16, a first inner conducting layer 18, a second inner conducting layer 20 and a contact pad layer 22. A plurality of die pads 30 disposed on the integrated circuit 12 are electrically connected to bonding ring 32 and bonding fingers 34 disposed on the top surface 11 of the substrate 14 through conducting wires 40, 42 and 44. The bonding rings 32 and the bonding fingers 34 are electrically connected to via holes 26 through traces 17. The via holes 26 are electrically connected to the contact pad layer 22, which comprises a plurality of contact pads 24 formed on the bottom surface 15 of the substrate 14. In addition, the via holes 26 pass through the first inner conducting layer 18 and the second inner conducting layer 20 and may or may not make contact with those layers according to circuit design. To reduce the probability of an improper connection, a plurality of channels is formed in the first inner conducting layer 18 and the second conducting layer 20 and filled with a dielectric material 28. A plurality of solder balls 36 is adhered onto the contact pads 24 for connection with outside circuitry. A route from the integrated circuit to outside circuitry runs from the die pads 30, through the conducting wires 40, 42, 44, the bonding rings 32 and bonding fingers 34, the traces 17, thevia holes 26, the contact pads 24 and the solder balls 36. The solder balls connect the package to outside circuitry.

The route for connection with outside circuitry has to pass through the first inner conducting layer 18 for grounding,and the first inner conducting layer 18 is also called a ground plane. Likewise, the second inner conducting layer 20 is also called a power plane because it is used for connecting to the power.

Figure 2:
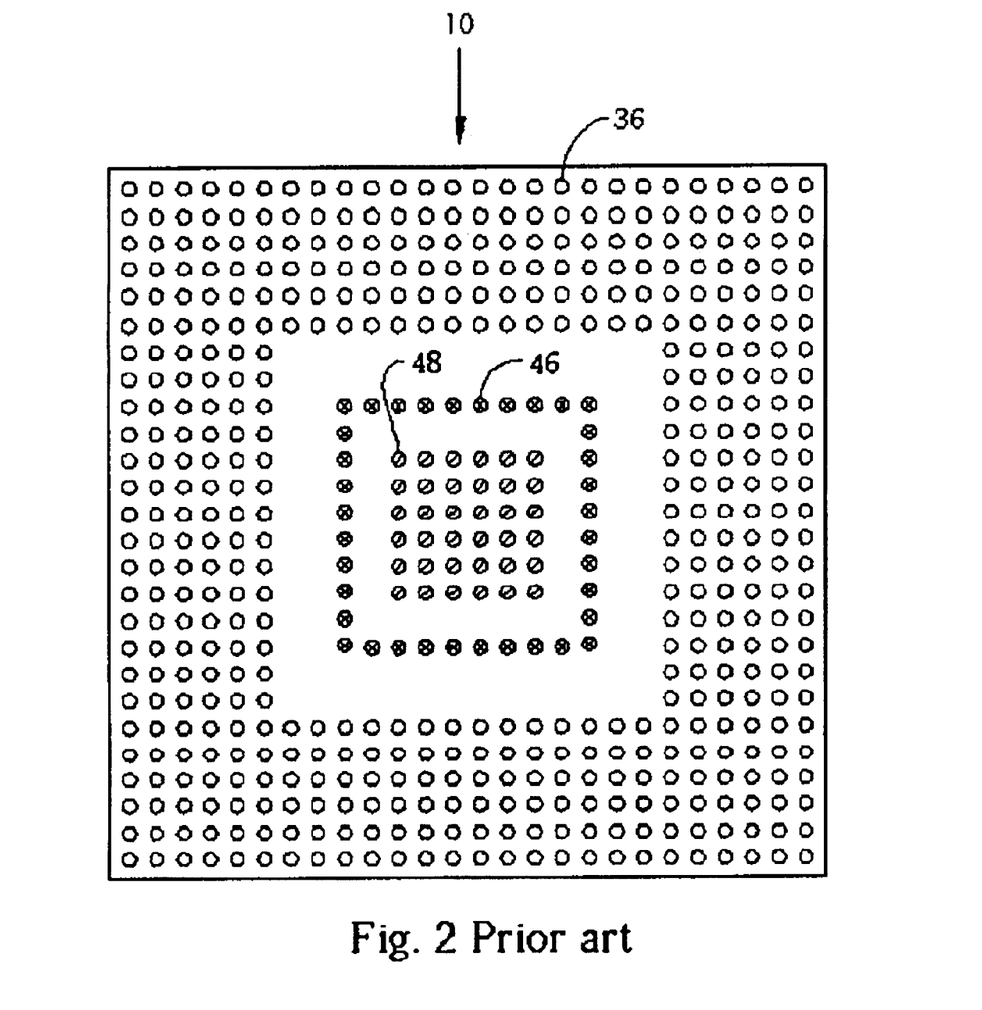
FIG. 2 is a bottom view of the package in FIG. 1.

Please refer to FIG. 2. FIG. 2 is a bottom view of the package 10. The solder balls 36 in FIG. 2 can be divided into three groups according to their position: a center array, an intermediate group, and an outer array. The center array is composed of ground solder balls 48 for grounding. The intermediate group of contact pads comprises power solder balls 46 for providing routes to connect the package 10 to the power. The ground solder balls 48 of the center array not only provide a route for grounding but also a route for heat dissipation. If only the outer array of contact pads were present, routes from the integrated circuit 12 to the solder balls 36 would be long, and the length of the routes would affect the efficiency of heat dissipation in the package 10. The addition of the center array of ground solder balls 48 allows redundant heat to be directly transferred to the outside circuitry.

Although the package 10 has more efficient heat dissipation, the presence of the intermediate group of contact pads causes narrow current routes. For detailed description, please refer to FIG. 3, which is a schematic diagram of the first inner conducting layer 18. The first inner conducting layer 18 is also the ground plane of the package 10. A peripheral portion 47 of the first inner conducting layer 18 comprises contact via holes 31 that electrically connect with the ground plane and intact via holes 33 that do not electrically connect with the ground plane. As discussed above, the first inner conducting layer 18 may have channels filled with dielectric materials 28 surrounding the via holes 26. Since the power solder balls 46 surround the ground solder balls 48 and the dielectric materials 28 surrounds the via holes 26, only a few narrow routes can be used to connect a central portion 49 of the ground plane with a peripheral portion 47 of the ground plane. This hindrance in current flow can lead to unexpected electro-magnetic interference and can further affect the operation of the integrated circuit 12 and efficiency of heat dissipation in the package 10.

SUMMARY OF INVENTION

It is an object of the claimed invention to provide a grid array package with increased grounding routes and a method of forming the same to solve the problem of grounding plane splitting.

In accordance with the claimed invention, the grid array package includes a substrate with a top surface and a bottom surface. On the bottom surface is aninner array of contact pads where two most adjacent contact pads of the inner array of contact pads are separated by a first distance, an outer array of contact pads where two most adjacent contact pads of the outer array of contact pads are separated by a second distance, and a intermediate group of contact pads with at least one ground contact pad for grounding the grid array package. The intermediate group of contact pads is located between the inner array of contact pads and the outer array of contact pads, and is separated from the inner array of contact pads by a third distance and from the outer array of contact pads by a fourth distance. The third distance and the fourth distance are greater than the first distance and the second distance.

It is an advantage of the claimed invention that the package has an increased number of grounding routes to improve the efficiency of heat dissipation.

These and other objectives of the claimed invention will no doubt become obvious to those of ordinary skill in the art after reading the following detailed description of the preferred embodiment which is illustrated in the various figures and drawings.

DETAILED DESCRIPTION

In the preferred embodiment, a four-layer ball grid array package is illustrated.

Figure 4:
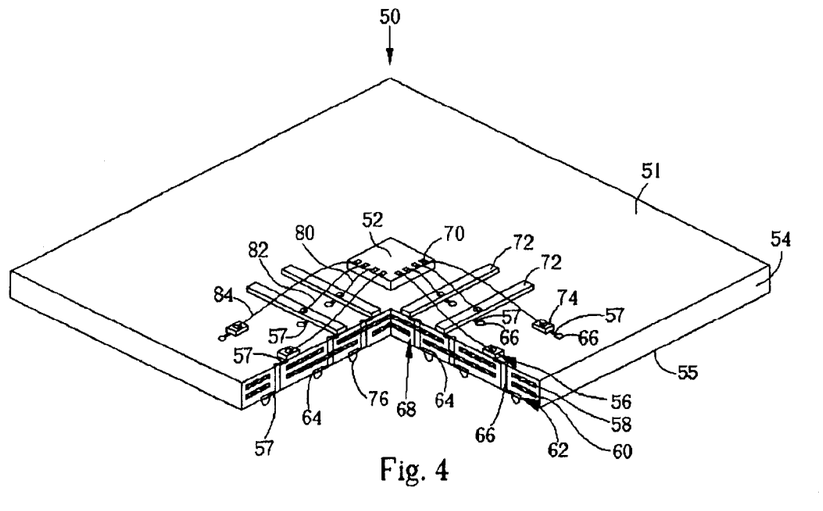
FIG. 4 is a structural schematic diagram of a grid array package according to the present invention.

Please refer to FIG. 4, which is a structural schematic diagram of a four-layer ball grid array package 50 according to the present invention for packaging an integrated circuit 52. The package 50 comprises a substrate 54 with a top surface 51 and a bottom surface 55. The integrated circuit 52 is set on the top surface 51 of the substrate 54. The substrate 54 comprises four layers: a bonding pad layer 56, a first inner conducting layer 58 as a ground plane, a second inner conducting layer 60 as a power plane, and a contact pad layer 62. A plurality of die pads 70 disposed on the integrated circuit 52 are electrically connected to bonding rings 72 and bonding fingers 74 on the top surface 51 of the substrate 54 through conducting wires 80, 82, and 84. The bonding rings 72 and the bonding fingers 74 are electrically connected to via holes 66 through traces 57. The via holes 66 are electrically connected to the contact pad layer 62 composed of a plurality of contact pads 64 formed on the bottom surface 55 of the substrate 54. In addition, the via holes 66 can connect to the first inner conducting layer 58 or the second inner conducting layer 60 as they pass through, according to the circuit design. To reduce the probability of improper connection of the via holes 66 with the first inner conducting layer 58 or the second inner conducting layer 60, a plurality of channels filled with dielectric materials 69 are formed in the first inner conducting layer 58 and the second inner conducting layer 60. This allows the via holes 66 to pass through without accidental connection. A plurality of solder balls 76 are positioned on the contact pads 64 and are used for connecting to outside circuitry. The route of the integrated circuit 52 to connect with outside circuitry is from die pads 70, through the conducting wires 80, 82, 84, the bonding rings 72 and bonding fingers 74, the traces 57, the via holes 66, the contact pads 64, the solder balls 76 to outside circuitry.

Figure 5:
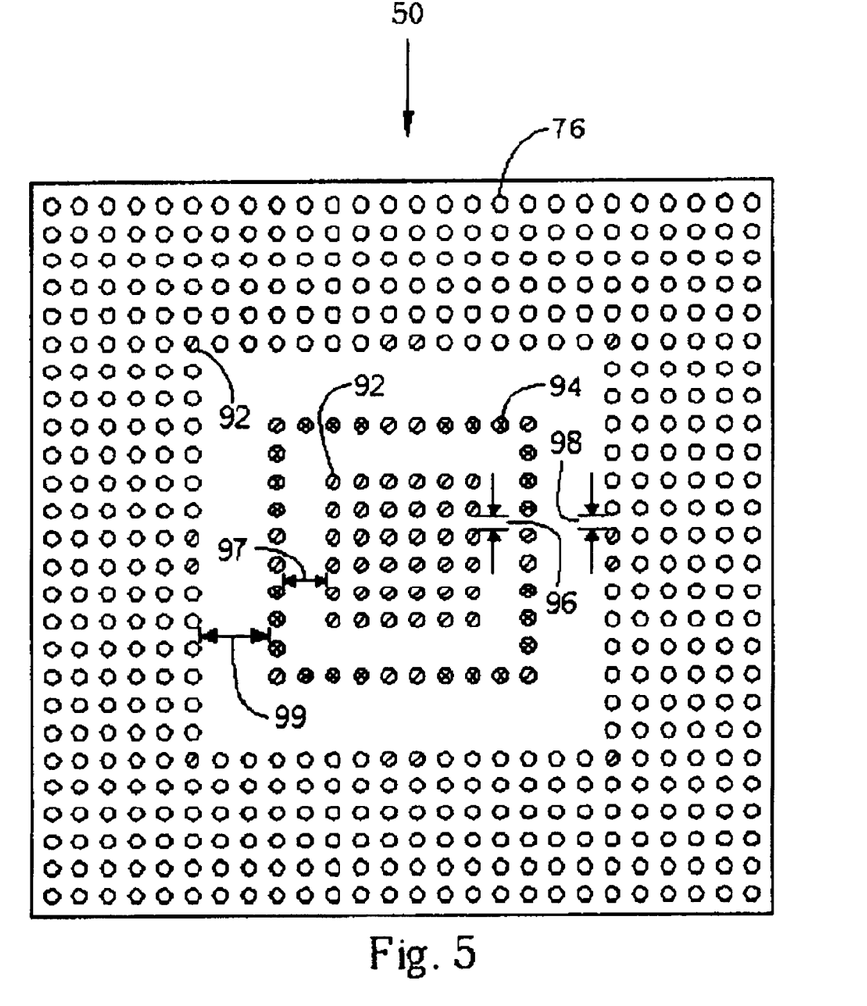
FIG. 5 is a bottom view of the package of the present invention.

Please refer to FIG. 5, which is a bottom view of the package 50 according to the present invention. The solder balls 76 formed on the bottom surface of the package 50 can be divided into three groups according to their position: an center array, a intermediate group, and an outer array. The center array of contact pads are comprise ground solder balls 92 for providing grounding routes to the package 50, and two most adjacent contact pads of the inner array of contact pads are separated by a first distance 96. The most significant difference between the package 50 according to the present invention and the package 10 according to the prior art is the composition of the intermediate group of contact pads. The intermediate group of contact pads comprises power solder balls 94 and ground solder balls 92. The outer array of contact pads comprises solder balls for different purposes, and two most adjacent contact pads of the outer array of contact pads are separated by a second distance 98. The intermediate group of contact pads is formed between the center array of contact pads and the outer array of contact pads and is separated from the center array of contact pads by a third distance 97 and from the outer array of contact pads by a fourth distance 99. The third distance 97 and the fourth distance 99 are greater than the first distance 96 and the second distance 98. Solder balls connected to contact pads positioned at the corners of the intermediate group of contact pads are ground solder balls 92. The innermost part of the outer array of contact pads also comprises ground solder balls 92.

Figure 6:
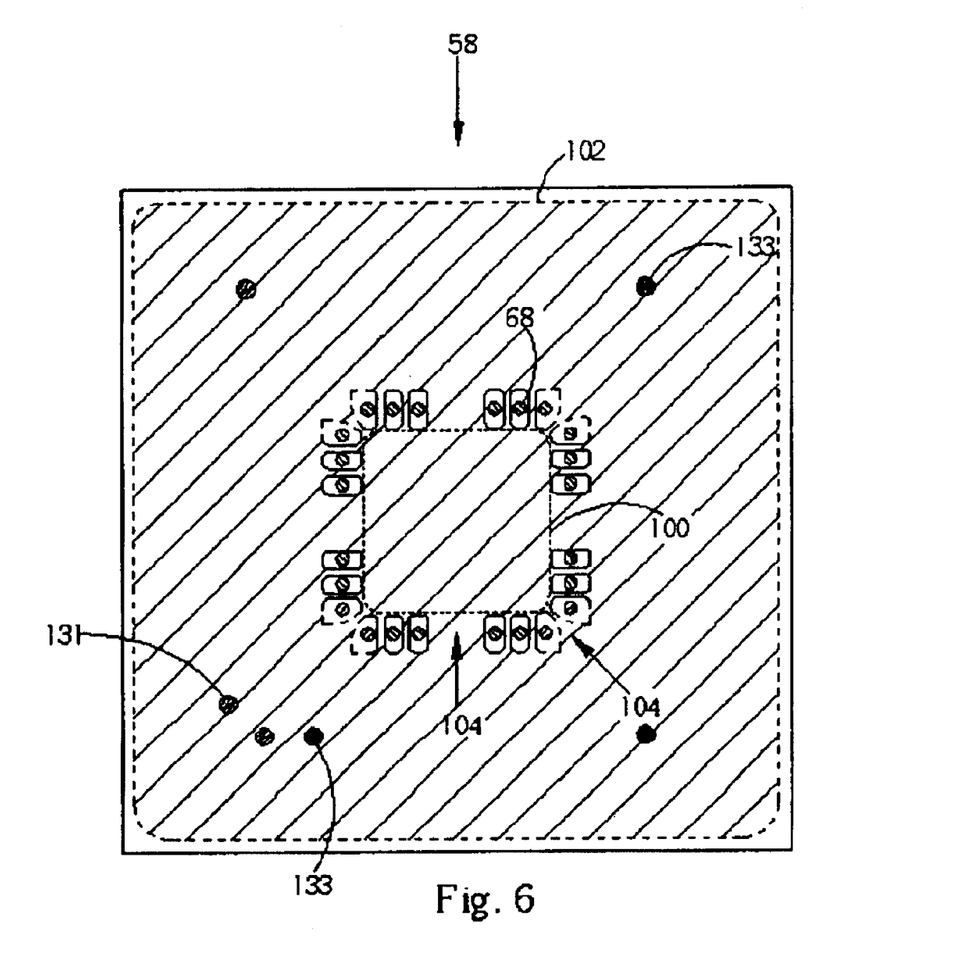
FIG. 6 is a schematic diagram of a first inner conducting layer of the package in FIG. 4.

Advantages of the package 50 are shown in FIG. 6 of a schematic diagram of the first inner conducting layer 58, also called the ground plane, of the package 50. The peripheral portion 102 of the ground plane has a plurality of contact via holes 131, which electrically connect with the ground plane, and a plurality of intact via holes 133, which do not electrically connect with the ground plane. The ground plane of the first inner conducting layer 58 comprises channels filled with dielectric materials 68 through which via holes 66 electrically connect to the center group of contact pads. Since ground solder balls 92 are positioned at the corners of the intermediate group of contact pads, enough space is provided for electrical routes 104 between the central portion 100 and the peripheral portion 102 of the ground plane. Such a design differs with the prior art, whose electrical routes between the central portion 49 and the peripheral portion 47 of the ground plane are obstructed by the presence of dielectric materials 28. As a result, the package 50 of the present invention can prevent electrical routes of the ground plane from being too narrow.

Figure 3:
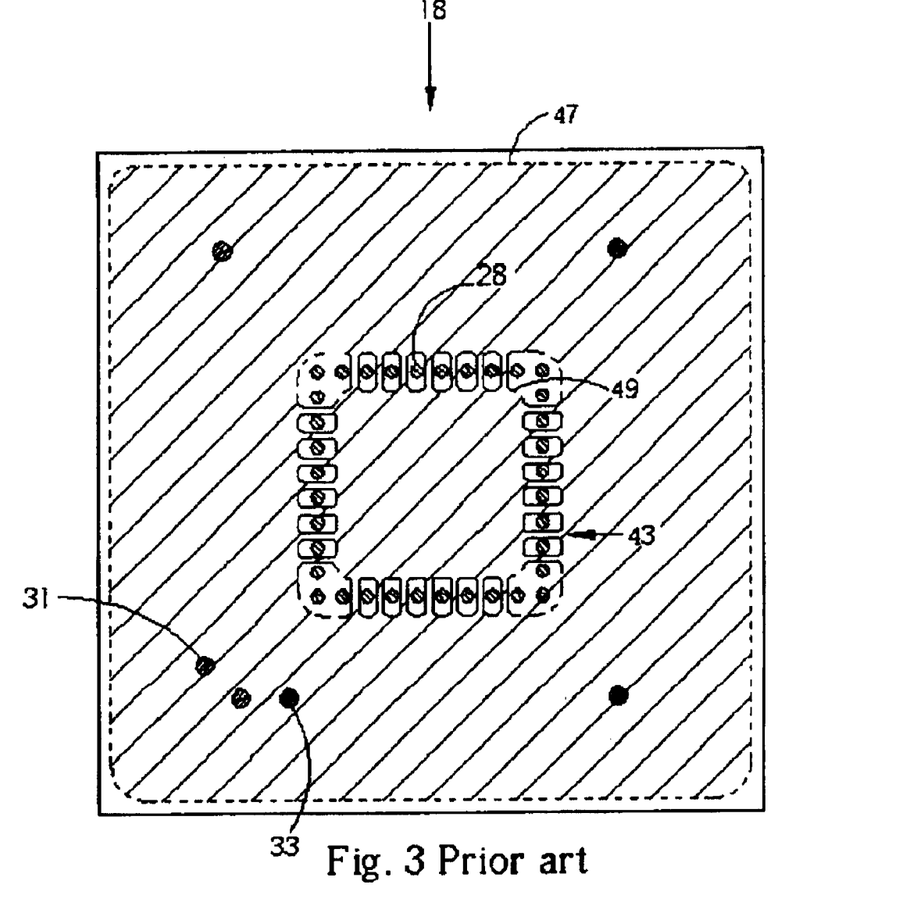
FIG. 3 is a schematic diagram of a first inner conducting layer of the package in FIG. 1.

In brief, the intermediate group of contact pads of the package 10 according to the prior art constitutes only power solder balls 46, which can hinder current flow between the central portion 49 and the peripheral portion 47 of the ground plane of the first inner conducting layer 18. Such a hindrance leads to unexpected electro-magnetic interference, affects the operations of the integrated circuit 18, and affects heat dissipation of the package 10. In contrast to the prior art, the package 50 of the present invention sets power solder balls 94 and ground solder balls 92 on the intermediate group of contact pads. This novel arrangement provides a stable power supply to the integrated circuit from the power solder balls 94 and maintains smooth electrical grounding routes that are not so narrow as to cause performance problems.

Those skilled in the art will readily observe that numerous modifications and alterations of the device may be made while retaining the teachings of the invention. Accordingly, the above disclosure should be construed as limited only by metes and bounds of the appended claims.

What is claimed is:

1. A grid array package comprising:

a substrate with a top surface and a bottom surface;

an inner array of contact pads formed on the bottom surface with two most adjacent contact pads of the inner array of contact pads separated by a first distance;

an outer array of contact pads formed on the bottom surface with two most adjacent contact pads of the outer array of contact pads separated by a second distance; and an intermediate group of contact pads formed on the bottom surface, the contact pads positioned at corners of the intermediate group of contact pads are ground contact pads for grounding the grid array package;

wherein the intermediate group of contact pads is formed between the inner array of contact pads and the outer array of contact pads and is separated from the inner array of contact pads by a third distance and from the outer array of contact pads by a fourth distance, the third distance and the fourth distance being greater than the first distance and the second distance.

2. The grid array package of claim 1 wherein the intermediate group of contact pads comprises a plurality of power contact pads for connecting the grid array package to power.

3. The grid array package of claim 1 further comprising an integrated circuit formed on the top surface of the substrate.

4. The grid array package of claim 1 further comprising a plurality of solder balls adhered onto the contact pads formed on the bottom surface of the substrate.

5. A packaging method for forming a grid array package comprising:

forming a substrate with a top surface and a bottom surface;

forming an inner array of contact pads on the bottom surface of the substrate with two most adjacent contact pads of the inner array of contact pads separated by a first distance;

forming an outer array of contact pads on the bottom surface of the substrate with two most adjacent contact pads of the outer array separated by a second distance; and forming an intermediate group of contact pads on the bottom surface of the substrate, the contact pads positioned at corners of the intermediate group of contact pads are ground contact pads for grounding the grid array package;

wherein the intermediate group of contact pads is formed between the outer array of contact pads and the inner array of contact pads and is separated from the inner array of contact pads by a third distance and from the outer array of contact pads by a fourth distance, the third distance and the fourth distance being greater than the first distance and the second distance.

6. The packaging method of claim 5 wherein the intermediate group of contact pads comprises a plurality of power contact pad for connecting the grid array package to power.

7. The packaging method of claim 5 further comprising forming an integrated circuit on the top surface of the substrate.

8. The packaging method of claim 5 further comprising adhering a plurality of solder balls on the plurality of contact pads formed on the bottom surface of the substrate.

* * * * *

EX PARTE REEXAMINATION CERTIFICATE (10569th)
United States Patent
Chang (10) Number: US 6,515,362 C1
(45) Certificate Issued: Apr. 10, 2015

(54) GRID ARRAY PACKAGE WITH INCREASED ELECTRICAL GROUNDING ROUTES AND METHOD OF FABRICATION

(75) Inventor: Wen-Yuan Chang, Taipei Hsien (TW)

(73) Assignee: Via Technologies Inc., Taipei Hsien (TW)

Reexamination Request:
No. 90/006,756, Aug. 20, 2003

Reexamination Certificate for:
Patent No.: 6,515,362
Issued: Feb. 4, 2003
Appl. No.: 09/683,459
Filed: Jan. 3, 2002

(30) Foreign Application Priority Data

Jan. 12, 2001 (TW) .............. 90100703 A (51) Int. Cl.
*H01L 23/498* (2006.01)
*H01L 23/48* (2006.01)
*H01L 23/00* (2006.01)

(52) U.S. Cl.
CPC ......... *H01L 23/49838* (2013.01); *H01L 24/49* (2013.01); *H01L 2224/48091* (2013.01); *H01L 2224/48227* (2013.01); *H01L 2924/014* (2013.01); *H01L 2924/01033* (2013.01); *H01L 2224/48233* (2013.01); *H01L 2224/49433* (2013.01); *H01L 2924/14* (2013.01); *H01L 2924/01082* (2013.01); *H01L 2924/15311* (2013.01); *H01L 24/48* (2013.01)

(58) Field of Classification Search
USPC ......... 257/750, 758, 737, 748, 747, 775, 786, 257/67, 69, 59, E23.155
See application file for complete search history.

(56) References Cited

To view the complete listing of prior art documents cited during the proceeding for Reexamination Control Number 90/006,756, please refer to the USPTO's public Patent Application Information Retrieval (PAIR) system under the Display References tab.

*Primary Examiner* — Nathan Ha (57) ABSTRACT

A grid array package and a method for fabricating the same. The contact pads of the grid array package form three distinct groups: an outer array, a intermediate group, and a center array. The center array is positioned in the center of the package, the intermediate group forms a ring around the center array, and the outer array forms a ring around both the intermediate group and the inner array. The contact pads of the center array connect to ground. Most of the contact pads of the intermediate group connect to power, but selected contact pads of the intermediate group connect to ground. Within the outer array, most of the contact pads connect the integrated circuit to outside circuitry, but selected contact pads of the outer array connect to ground.

At the time of issuance and publication of this certificate, the patent remains subject to pending reissue application number 11/050,628 filed Feb. 3, 2005. The claim content of the patent may be subsequently revised if a reissue patent is issued from the reissue application.

US 6,515,362 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-8 are cancelled.

New claims 9-17 are added and determined to be patentable.

9. *A grid array package comprising:*
   *a substrate with a top surface and a bottom surface;*
   *an inner array of contact pads formed on the bottom surface with the two most adjacent contact pads of the inner array of contact pads separated by a first distance;*
   *an outer array of contact pads formed on the bottom surface with the two most adjacent contact pads of the outer array of contact pads separated by a second distance; and*
   *an intermediate group of contact pads formed between the inner array of contact pads and the outer array of contact pads on the bottom surface, the intermediate group of contact pads comprises a plurality of power contact pads for connecting the grid array package to power, and the contact pads positioned at corners of the intermediate group of contact pads are ground contact pads for grounding the grid array package;*
   *an inner conducting layer formed between the top surface and the bottom surface of the substrate, the inner conducting layer comprising:*
      *a central portion corresponding to the inner array of contact pads, projections of the inner array of contact pads are located in the central portion;*
      *a peripheral portion surrounding the central portion and corresponding to the outer array of contact pads and the intermediate group of contact pads, projections of the outer array of contact pads and the intermediate group of contact pads are located in the peripheral portion,*
   *wherein the inner conducting layer is electrically connected with the contact pads positioned at corners of the intermediate group, and is not electrically connected with the power contact pads of the intermediate group;*
   *wherein the intermediate group of contact pads is formed between the inner array of contact pads and the outer array of contact pads and is separated from the inner array of contact pads by a third distance and from the outer array of contact pads by a fourth distance, the third distance and the fourth distance being greater than the first distance and the second distance.*

10. *The grid array package of claim 9, wherein the inner conducting layer is a ground plane.*

11. *The grid array package of claim 9, wherein the inner conducting layer is electrically connected with the contact pads positioned at corners of the intermediate group through at least a contact via hole.*

12. *The grid array package of claim 9, wherein some of the peripheral portion neighbors on the central portion.*

13. *The grid array package of claim 9, wherein the inner conducting layer further comprising a plurality of channels for electrically isolating with peripheral portion, the positions of the channels correspond to the power contact pads of the intermediate group.*

14. *The grid array package of claim 13, wherein the channels neighbor the central portion.*

15. *The grid array package of claim 13, wherein the peripheral portion of the inner conducting layer further comprises a plurality of via holes, and the channels is filled with dielectric material to surround the via holes through which the power contact pads of the intermediate group is electrically connected with another inner conducting layer.*

16. *The grid array package of claim 15, wherein the another inner conducting layer is a power plane.*

17. *The grid array package of claim 9, wherein the peripheral portion of the inner conducting layer comprises a plurality of contact via holes electrically connected with the peripheral portion and a plurality of intact via holes not electrically connected with the peripheral portion.*

\* \* \* \* \*